United States Patent [19]

Hsieh et al.

[11] Patent Number: 5,428,750
[45] Date of Patent: Jun. 27, 1995

[54] BI-DIRECTIONAL BUFFERS FOR MOUNTING A PLURALITY OF INTEGRATED CIRCUIT DEVICES

[75] Inventors: Wen-Jai Hsieh, Vancouver, Wash.; Chi-Song Horng, Palo Alto, Calif.

[73] Assignee: I-Cube Design Systems, Inc., Santa Clara, Calif.

[21] Appl. No.: 171,751

[22] Filed: Dec. 21, 1993

Related U.S. Application Data

[63] Continuation of Ser. No. 846,511, Mar. 4, 1992, abandoned, which is a continuation-in-part of Ser. No. 785,082, Oct. 30, 1991, abandoned.

[51] Int. Cl.⁶ .............................................. G06F 13/00
[52] U.S. Cl. .................................... 395/275; 395/250
[58] Field of Search ............................. 395/250, 275

[56] References Cited

U.S. PATENT DOCUMENTS

| | | | |
|---|---|---|---|
| 4,703,394 | 10/1987 | Petit et al. | 361/413 |
| 4,766,534 | 8/1988 | DeBenedictis | 364/200 |
| 4,807,183 | 2/1989 | Kung et al. | 364/900 |
| 4,942,517 | 7/1990 | Cok | 364/200 |
| 4,968,977 | 11/1990 | Chinnaswamy et al. | 340/825.8 |
| 5,036,473 | 7/1991 | Butts et al. | 364/489 |
| 5,077,738 | 12/1991 | Larsen et al. | 371/15.1 |
| 5,088,091 | 2/1992 | Schroeder et al. | 370/94.3 |
| 5,175,728 | 12/1992 | Caplan et al. | 370/58.2 |

*Primary Examiner*—Thomas C. Lee
*Assistant Examiner*—Chris Shin
*Attorney, Agent, or Firm*—Smith-Hill and Bedell

[57] ABSTRACT

A field programmable logic module provides a set of sockets for mounting electronic components, a set of connector pins for providing external access to the board, and a set of field programmable interconnect devices (FPIDs). The FPIDs are buffered, multiple port cross-point switches that may be programmed by a host computer to selectively connect terminals of the components mounted in the sockets to one another or to the external connector pins. Signal buffers within the FPID ports can be programmed to provide various types of buffering and logic operations on the signals routed by the FPIDs.

3 Claims, 10 Drawing Sheets

BI-DIRECTIONAL BUFFERS FOR MOUNTING A PLURALITY OF INTEGRATED CIRCUIT DEVICES

CROSS-REFERENCE TO RELATED APPLICATIONS

This application is a continuation of U.S. patent application Ser. No. 846,511 filed Mar. 4, 1992, abandoned, which is a continuation-in-part of U.S. patent application Ser. No. 07/785,082, filed Oct. 30, 1991, now abandoned.

BACKGROUND OF THE INVENTION

The present invention relates in general to programmable logic devices and in particular to a field programmable logic module for flexibly interconnecting several digital logic devices.

Manufacturers of mass produced electronic equipment often use application specific integrated circuits (ASICs) to implement complex logic requirements. An ASIC can efficiently implement very large scale logic circuits in a small package, but an ASIC requires much time and money to develop. When large quantities of an ASIC are needed, the development cost may be relatively small on a per unit basis, but when only a few copies of an ASIC are needed, per unit development costs can be prohibitive. Also, the specific logic circuit implemented by an ASIC is fixed in the ASIC during fabrication and cannot be changed. Thus when a product change requires even a small change in the logic implemented by an ASIC, the ASIC must be redesigned and refabricated.

Field programmable logic devices (FPLDs) overcome some of the cost, time and inflexibility problems associated with using ASICs to implement logic circuitry. An FPLD is an integrated circuit which, like an ASIC, performs logic operations on one or more input signals to produce one or more output signals. However, an FPLD can be programmed by externally generated programming signals to implement user-specified digital logic operations. FPLDs are often used in place of ASICs in prototype equipment and in equipment produced in limited quantities. FPLDs are also used to implement logic circuits that are expected to change. Early embodiments of the concept include programmable array logic devices (PALs) and programmable logic devices (PLDs). PALs and PLDs serve as a convenient means for integrating a small number (typically 5 to 10) of small or medium scale integrated devices. In recent years, a new variety of programmable logic device, the Field Programmable Gate Array (FPGA) offering a much higher capacity (thousands of gates) and architectural flexibility, has gained wide popularity among designers.

While FPLDs are less expensive and more flexible than ASICs, they are also less efficient; they cannot implement in a single package as complex a logic circuit as an ASIC. When a block of logic is too large to implement in a single FPLD, a designer can partition the logic block into smaller blocks, each of which may be implemented by a separate programmable logic device or other components. However, the problem of interconnecting separate FPLDs often proves very troublesome. When a designer implements a logic block using several FPLDs, the designer must create a circuit board to interconnect them. Circuit boards are inflexible and time-consuming to manufacture. A change to the design of a logic system implemented by a set of interconnected FPLDs may require fabrication of a new circuit board. Thus the advantage of being able to quickly modify and test various designs of a logic block implemented by FPLDs may be lost when the designer is forced to fabricate new circuit boards to interconnect them.

One solution is to impose severe restrictions on the permissible partitions of the logic block so as not to disturb the interconnections between FPLDs implementing the block. However, this is undesirable because it places unnecessary limitations on the design.

U.S. Pat. No. 5,036,473 entitled "METHOD OF USING ELECTRONICALLY RECONFIGURABLE LOGIC CIRCUITS", issued Jul. 30, 1991 to Butts et al, attempts to solve the problems of both implementing and interconnecting blocks of logic of a prototype circuit by providing a circuit board on which several FPLDs and programmable crossbar switches are permanently mounted. There are also sockets for mounting other circuit components such as custom integrated circuits that may be supplied by a user.

A crossbar switch has several I/O pins and can be programmed by an externally generated programming signal to route data signals arriving on any one I/O pin to any other I/O pin. In the Butts et al system, the I/O pins of the crossbar switches are connected to one another and to the I/O ports of the FPLDs and user device sockets in a distributed fashion. By properly programming the crossbar switches, an I/O port of any FPLD or user supplied device can be connected to an I/O port of any other FPLD or to any other I/O port of any user-supplied device mounted on the board. With this system, when change to a block of logic implemented by FPLDs requires changes in interconnections therebetween, the interconnection changes can be quickly and easily handled by reprogramming the crossbar switches. No change in circuit board hardware is required.

Crossbar switches of the prior art may be either active or passive. An "active" crossbar switch includes buffers that actively drive signals at its output I/O pins in response to signals at its input I/O pins. Active buffering ensures that the signals are not degraded as they pass through the crossbar switches between FPLDs. A "passive" crossbar switch simply passes signals between its I/O pins without buffering. Passive crossbar switches can accommodate either unidirectional or bi-directional signals, but since the signals must pass through unidirectional buffers, prior art active crossbar switches can only accommodate unidirectional signals.

Butts et al disclose active buffering to interconnect FPLDs and user supplied components mounted on the board. A problem arises when the block of logic to be implemented includes bi-directional buses. Butts et al suggest either avoiding bi-directional buses by partitioning bi-directional buses into two unidirectional buses (FIGS. 13 and 14) or using logic or gating in the crossbar switch to enable buffers in the crossbar switch (FIGS. 15 and 16). In the former case, the devices being interconnected must have an input and an output terminal because the "bi-directional" bus is actually two unidirectional buses. In the latter case, the devices being interconnected by a true bi-directional bus must supply the crossbar switch with an enable signal input indicating direction of signal flow.

These methods solve the problem of actively buffering "bi-directional" signals passing between components only when the designer has control over the implementation of the devices being interconnected. The designer must ensure that such devices have only unidirectional inputs and outputs or that the devices supply an extra direction indicating enable signal with each bi-directional input/output signal. In cases where the logic is entirely implemented by FPLDs, the designer does have such control over device implementation. However, in many cases the user may wish to interconnect existing integrated circuits that have true bi-directional input/output buses but do not provide output direction indicating enable signals. In such situation, the Butts et al system is unable to provide actively buffered bi-directional interfaces between circuit components.

SUMMARY OF THE INVENTION

In accordance with one aspect of the present invention, a field programmable logic module (FPLM) includes a set of sockets for mounting field programmable logic devices (FPLDs) or other integrated circuits mounted on top of a small (suitably 4"×5"), rectangular circuit board. A set of connector pins is distributed along edges of the circuit board for making physical and electrical connection to a socket mounted on other equipment. An array of field programmable interconnect devices (FPIDs) is mounted on the underside of the circuit board. Each FPID is an integrated circuit chip including a multiple port, cross-point switch. Conductors mounted on the board connect various ports of each FPID to ports of other FPIDs, to the connector pins along the edge of the board, and to holes in the sockets. The FPIDs may be programmed to logically connect any pin of FPLDs or other devices mounted in the sockets to any set of one or more pins of any other devices mounted in the sockets or to any set of one or more connector pins along the edge of the circuit board. Thus, for example, to implement a large logic circuit a user may first program a set of FPLDs to implement separate portions of the logic circuit and then install them in the sockets. The user then programs the FPIDs to make the necessary interconnections between the FPIDs and external connector pins. When the user mounts the FPLM in a suitable socket on another circuit board, the FPLM operates as a large scale integrated circuit.

In accordance with another aspect of the invention, on system power up a booting logic circuit mounted on the circuit board reads programming data from an erasable programmable read only memory (EPROM) also mounted on the circuit board. The booting logic circuit transmits the programming data to the FPIDs. This data tells the FPIDs how to make the appropriate connections between pins of devices mounted in the sockets and pins mounted on the edge of the circuit board. A user programs the FPIDs by loading data into the EPROM and installing the EPROM in its socket on the module prior to power up.

It is accordingly an object of the invention to provide a system for flexibly mounting and interconnecting components of an electronic system.

It is another object of the invention to provide a system for implementing a large scale digital logic circuit wherein the design of the logic circuit may be easily and quickly changed.

The concluding portion of this specification particularly points out and distinctly claims the subject matter of the present invention. However, those skilled in the art will best understand both the organization and method of operation of the invention, together with further advantages and objects thereof, by reading the following description in view of the accompanying drawings wherein like reference characters refer to like elements.

DESCRIPTION OF THE PREFERRED EMBODIMENT

The present invention relates to a field programmable logic module (FPLM), an apparatus for mounting and, flexibly interconnecting several separately packaged digital electronic devices. For example, the FPLM may interconnect a set of field programmable logic devices so as to implement a large scale logic circuit. The FPLM also provides means for integrating the implemented logic circuit into a larger electronic system.

Figure 1:
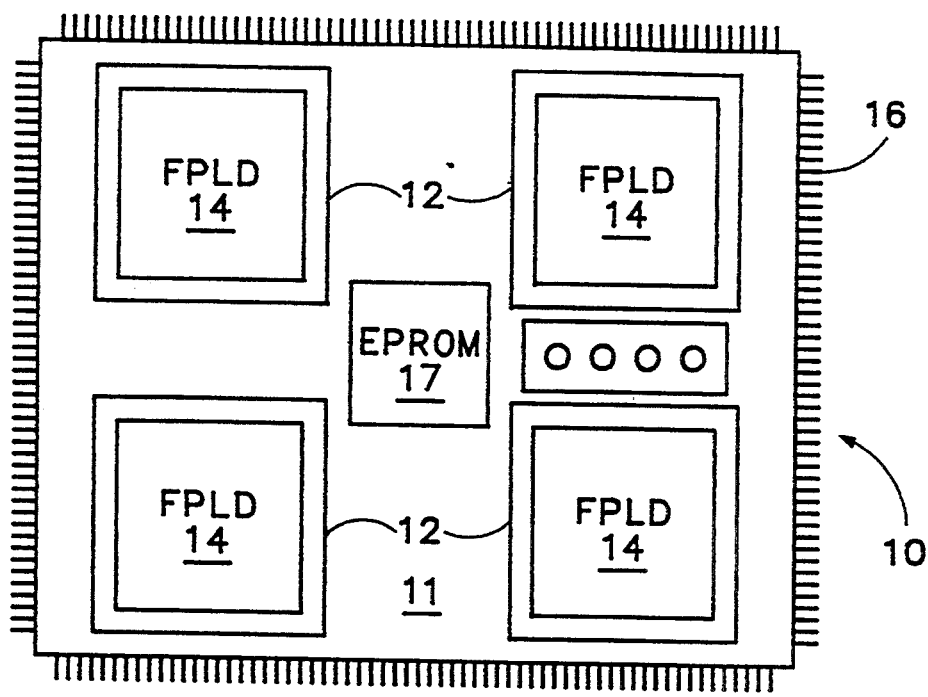
FIG. 1 illustrates a top view of a field programmable logic module in accordance with the present invention.
Figure 2:
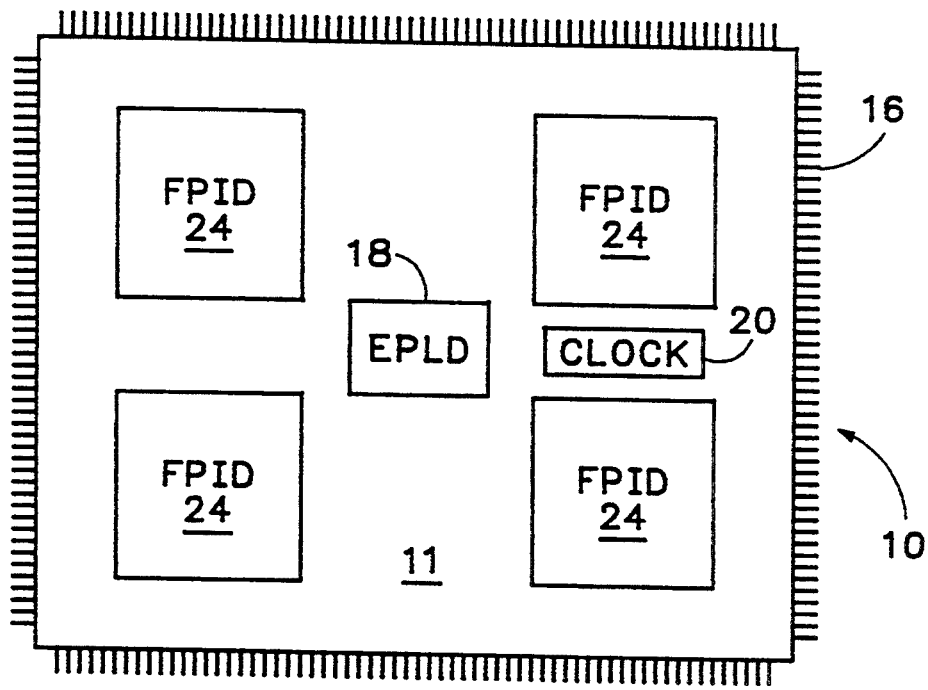
FIG. 2 illustrates a bottom view of the field programmable logic module in accordance with the present invention.
Figure 3:
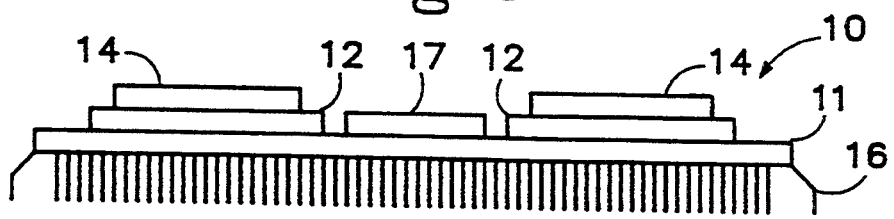
FIG. 3 illustrates a side view of the field programable logic module in accordance with the present invention.

FIGS. 1, 2 and 3 respectively illustrate top, bottom and side views of a preferred embodiment of an FPLM 10 in accordance with the present invention. FPLM 10 includes a multiple layer circuit board 11 (suitably 4" by 5" ) on top of which are mounted four sockets 12 for receiving integrated circuits to be interconnected. In the preferred embodiment these integrated circuits are field programmable logic devices (FPLDs) 14. An FPLD is a device which can be programmed by an externally generated signal to implement any of a variety of logic circuits. In alternative embodiments, other digital logic devices such as, for example, application specific integrated circuits may be used in lieu of some or all of the FPLDs, and sockets 12 may be adapted to receive nearly any kind of digital logic device.

In the preferred embodiment, FPLM 10 also includes a set of 208 external pins 16 for making electrical connection to a socket (not shown) within other electronic equipment so that FPLM 10 may operate as a component thereof. FPLM 10 also includes a set of four field programmable interconnect devices (FPIDs) 24 mounted on the underside of circuit board 11. Each FPID 24 is an integrated circuit chip including a 160-port cross-point switch that can be programmed to logically connect any one port to any other set of one or more ports. The external pins 16 and the pins of each logic device 14 mounted in sockets 12 are connected by conductors on or passing through layers of board 11 to ports of FPIDs 24. By properly programming FPIDs 24, a signal appearing on any pin of a device mounted in a socket 12 can be routed to any set of one or more other pins of the same or any other socket 12 or to any set of external connector pins 16.

An electronically programmable read only memory (EPROM) 17 is also mounted on upper side of board 11. EPROM 17 contains programming data for controlling the way in which FPIDs 24 route signals between pins of FPLDs 14 and external connector pins 16. Programming data may be loaded into EPROM 17 in a well-known fashion by removing EPROM 17 from its socket and placing in a suitable EPROM programming apparatus.

An electronically programmable logic device (EPLD) 18, suitably an Altera model EPM 5064, is also mounted on the underside of board 11. On system power up, EPLD 18 reads the programming data out of EPROM 17 and transmits it to FPIDs 24 via an IEEE standard 1149.1 "JTAG" bus formed by conductors on board 11 connecting EPLD 18 to FPIDs 24. As described in detail hereinbelow, the programming data tells the FPIDs how to route signals between pins of devices mounted in sockets 12 and external connector pins 16. The programming data also selects from among various modes of operation of buffers within the FPIDs. A clock circuit 20 also mounted on the underside of board 11 clocks EPLD 18.

Figure 4:
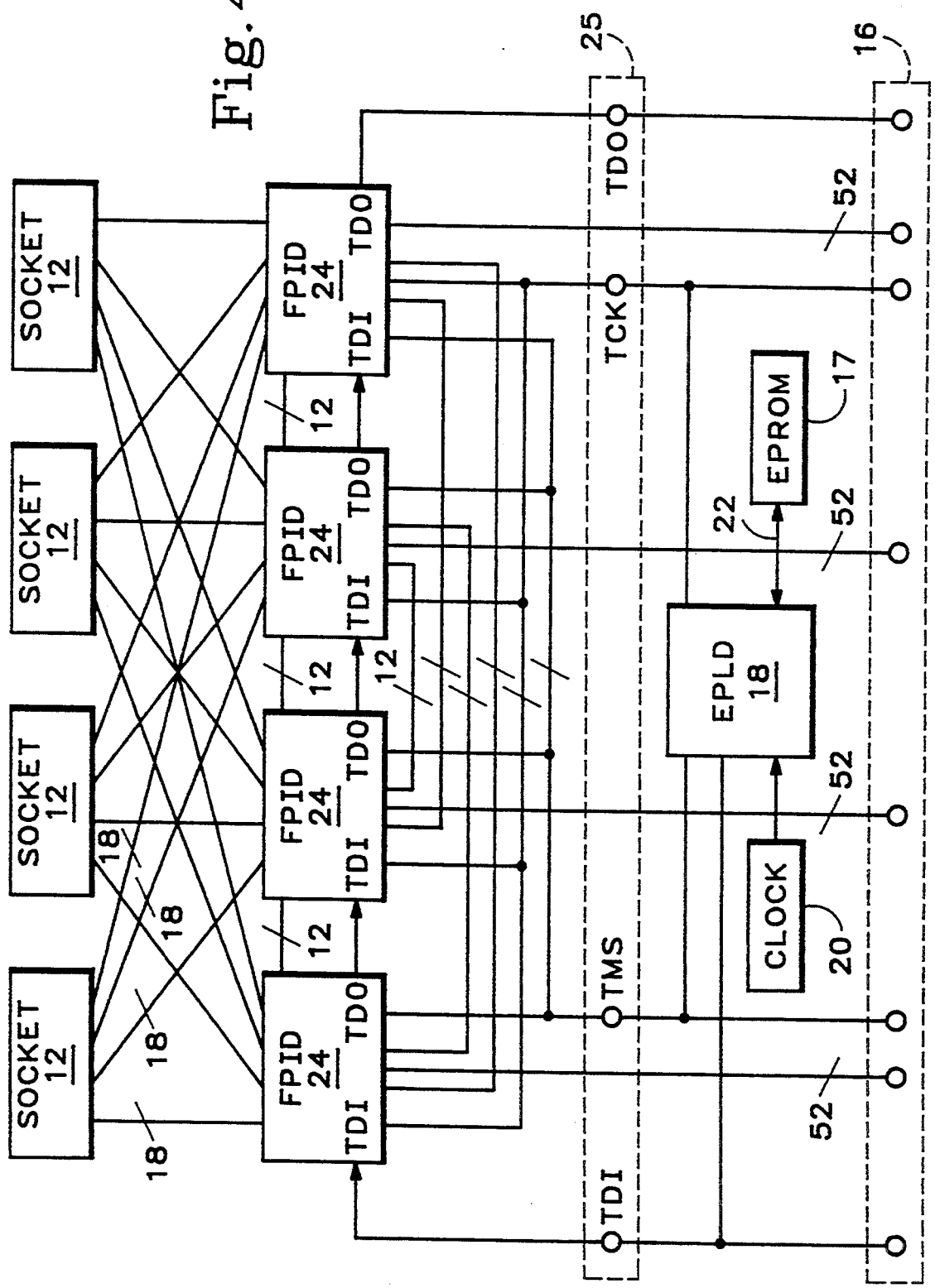
FIG. 4 is a block diagram of the field programable logic module in accordance with the present invention.

FIG. 4 illustrates FPLM 10 of FIGS. 1-3 in block diagram form including schematic representations of conductors interconnecting the various components mounted on FPLM 10. In the preferred embodiment, each socket 12 has 72 socket holes for receiving signal pins of devices mounted therein. Conductors on and through layers of board 11 of FIGS. 1-3 interconnect a separate set of 18 socket holes in each socket 12 to I/O ports of each FPID 24. These conductors also interconnect a separate set of 12 I/O ports of each FPID 24 to corresponding ports of each other FPID 24 and connect 52 I/O ports of each FPID to separate external pins 16.

Note that:
1) each I/O pin of an integrated circuit inserted in any socket 12 is hard wired to a separate input/output port of one of the four FPIDs 24,
2) each external connector pin 16 is hard wired to a separate input/output port of one of the four FPIDs,
3) each FPID 24 has 12 input/output ports hard wired to similar input/output ports of the other FPIDs 24, and.
4) each FPID 24 can be programmed to logically interconnect any two or more of its ports.

Thus it will be appreciated that by programming FPIDs 24 to logically interconnect selected sets of their ports, a pin of a device inserted in any socket 12 can be logically connected to any other set of pins of devices inserted in any other set of socket 12 or to any set of external pin 16.

As mentioned hereinabove, EPLD 18 programs FPIDs 24 on system power up by reading programming data out of EPROM 17 and transmitting it to FPIDs 24 via the JTAG bus. EPLD 18 read accesses the programming data in EPROM 17 through a conventional memory bus 22. The JTAG bus enabling EPLD 18 to load the programming data from EPROM 17 into FPIDs 24 consists of four lines: TDI, TDO, TMS and TCK. EPLD 18 provides the TMS and TCK signals in parallel to each FPID 24. The four FPIDs 24 are connected in series with the TDO output of the first FPID 24 providing the TDI input to the next. EPLD 18 transmits programming data in serial fashion via the TDI line of the JTAG bus to the TDI input of the first FPID 24 of the series. This programming data passes through shift registers in each FPID 24 in succession via the TDI/TDO series connections. EPLD 18 supplies a signal TCK which clocks the programming data through the FPIDs 24 and a signal TMS which controls data transmission modes in a manner described herein below.

When EPROM 17 is removed, EPLD 18 does not program FPIDs 24 or otherwise take control of the JTAG bus lines on system start up. In such case, the FPIDs 24 may be programmed by an external host computer (not shown) accessing the four JTAG bus lines via a four hole socket 25 mounted on the top of board 11 of FIG. 1. A host computer may also access the four JTAG lines through four of the external connector pins 16 which are connected to the four JTAG lines as illustrated in FIG. 4.

Figure 5:
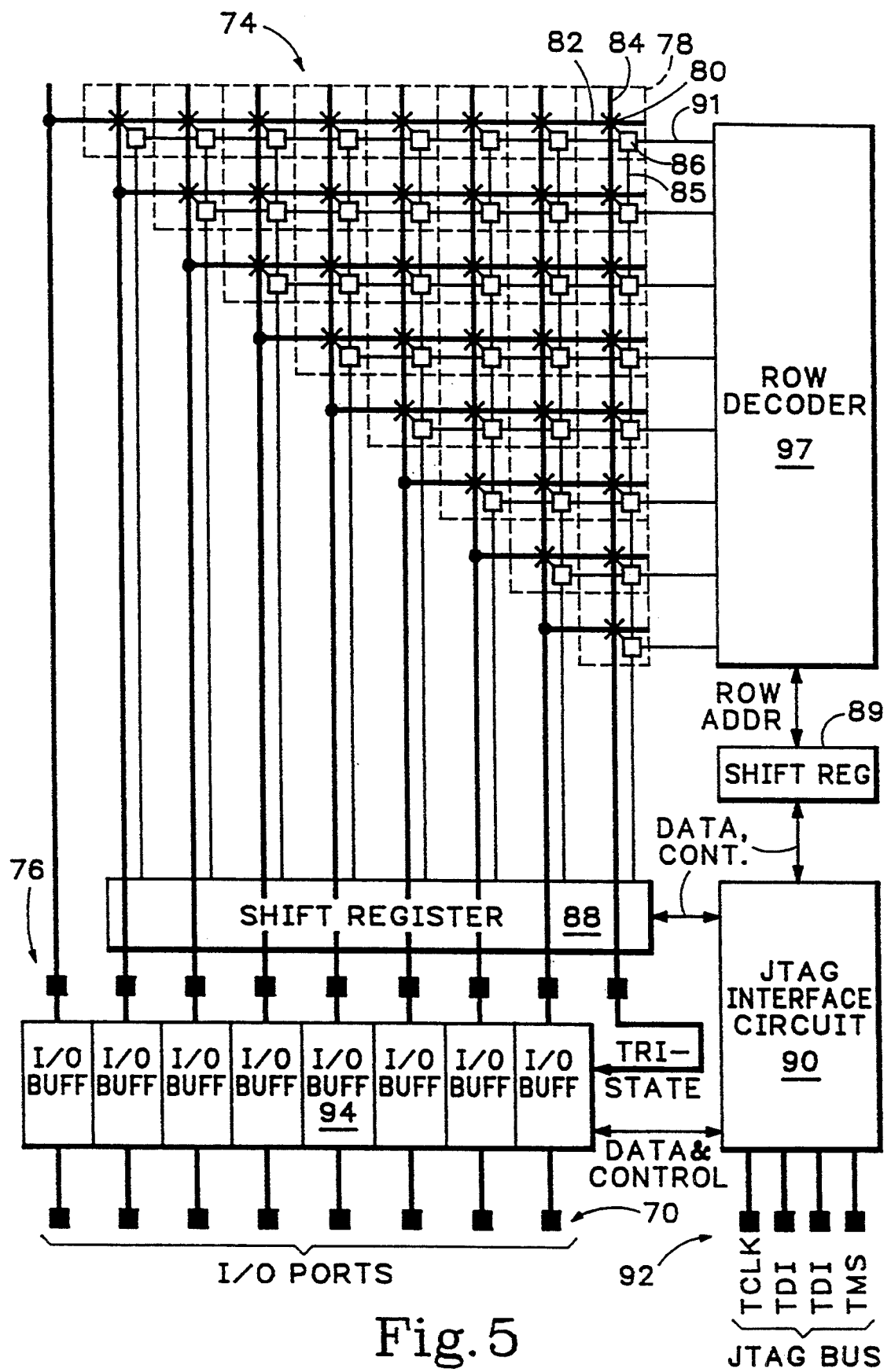
FIGS. 5 and 6 illustrate a scaled-down version of a field programable interconnect device of FIGS. 2 and 4 in block diagram form.

FIG. 5 illustrates an FPID 24 of FIG. 4 in simplified block diagram form. In the preferred embodiment of the invention, each FPID is a 208-pin integrated circuit. Of these 208 pins, 160 pins provide input/output ports 70 for signals to or from other parts of the FPLM 10 of FIG. 4. In FIG. 5, only 8 ports of the total 160 are shown. FPID 24 also includes a 176-port cross-point switch 74. Switch 74 can selectively connect any one of its 176 ports 76 to any one or more of its other ports. In FIG. 5, only 9 switch array ports 76 of the total 176 are shown. Switch 74 comprises a triangular array of 176 rows and columns of cross-point switch cells 78. (Only 8 rows and 9 columns are shown in FIG. 5.)

Each switch cell 78 consists of a switch 80 and a memory cell 86. Switch 80 selectively interconnects one horizontal signal line 82 with one vertical signal line 84. Memory cell 86 stores a single data bit. The state of the stored data bit controls the state of switch 80. When the stored bit is high, the switch connects the horizontal and vertical signal lines 82 and 84 passing through the cell. When the stored bit is low, the vertical and horizontal signal lines are disconnected. Each horizontal signal line 82 passes through all cells 78 of a separate array row, and each vertical signal line 84 passes through all cells 78 of a separate array column. Each one of the horizontal signal lines 82 and each one of the vertical signal lines 84 are hard wired to a corresponding one of the 176 array ports 76 of the cross-point switch 74.

By placing the appropriate data bits in the memory cells 86 of switch cells 78, any array port 76 may be connected to any other port or set of array ports 76. A separate data bit is concurrently supplied as input to the memory cells of each cell column through data outputs 85 of a 175-bit shift register 88. The JTAG interface circuit 90, responding to instructions from the host computer via the JTAG bus 92, shifts 175 data bits from the JTAG bus into shift register 88. JTAG interface circuit 90 also stores a row address received via the JTAG bus in a shift register 89. A row decoder 97 decodes the row address stored in shift register 89 to input enable the memory cells 86 of one row of switch cells 78 via one of memory control lines 91 supplied in parallel to each memory cell of a row so that each memory cell of the row stores a separate one of the 175 data bits from shift register 88. To program the entire switch, the process of storing data in shift register 88 and input enabling a row of memory cells is repeated for each of the 176 cell rows of the cross-point array. A set of 160 input/output buffers 94 interconnects the 160 FPID I/O ports 70 with 160 of the 176 array ports 76 of cross-point switch 74. Eight of the 176 array ports 76 provide tri-state control inputs TS0–TS7 to I/O buffers 94.

Figure 6:
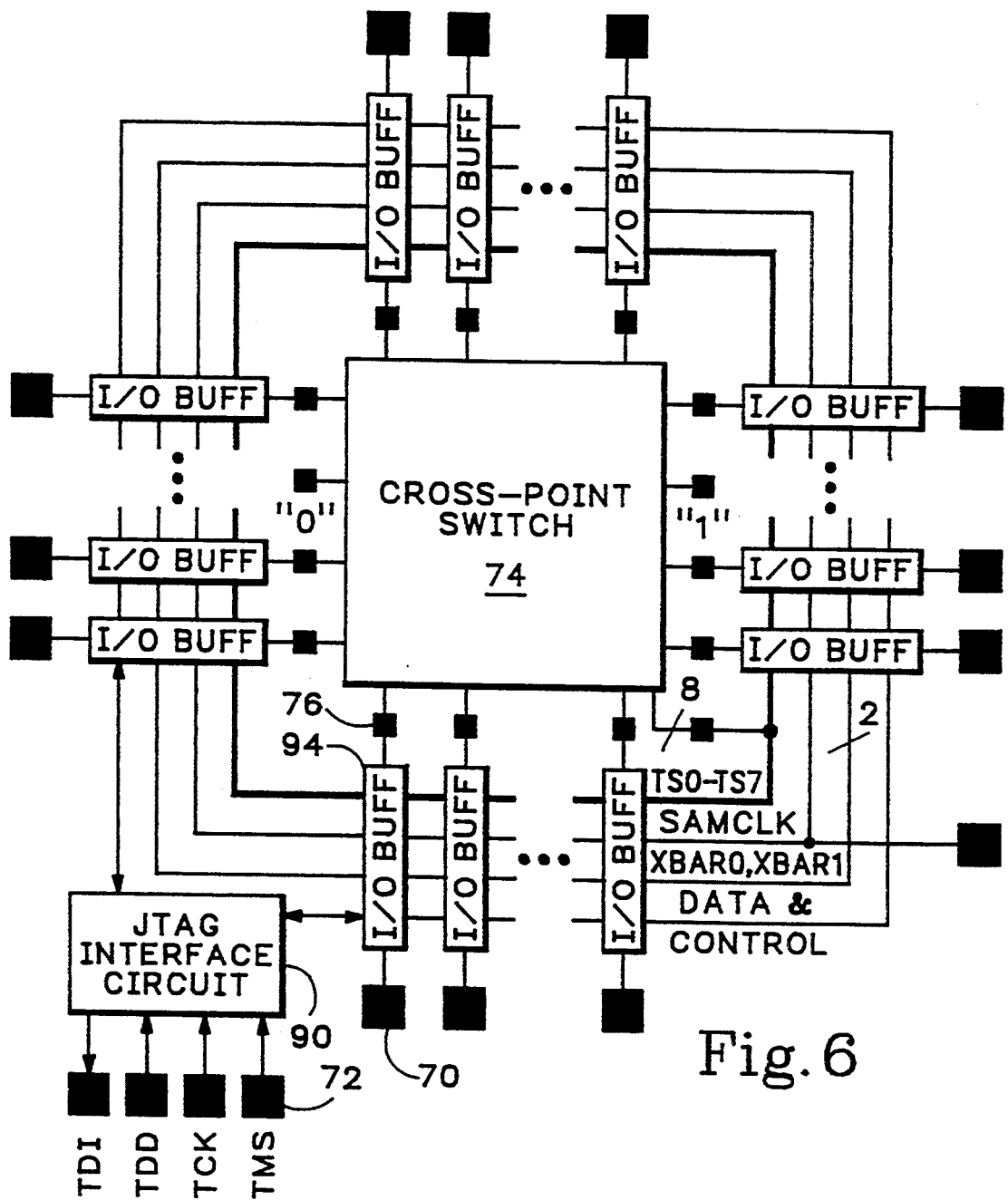

FIG. 6 also shows an FPID 24 of FIG. 4 in block diagram form. Shift registers 87 and 88 and row decoder 97 shown in FIG. 5 are omitted in FIG. 6. In FIG. 6 I/O buffers 94 are shown surrounding cross-point switch 74 and connecting FPID I/O ports 70 to ports 76 of cross-point switch 74. High ("1") and low ("0") logic levels drive an additional pair of cross-point switch array ports 76. Eight ports 76 of switch 74 drive tri-state control lines TS0-TS7 connected in parallel to each of I/O buffers 94. A clock signal SAMCLK applied to another I/O port 70 is connected in parallel to each I/O buffer 94 to control data sampling in a manner described hereinbelow. A pair of "outer cross-bar" lines XBAR0 and XBAR1 is also connected in parallel to all I/O buffers 94. Switches in each buffer 94 can be programmed to connect its pin side port 70 to either the XBAR0 or XBAR1. The XBAR1 and XBAR0 lines facilitate testing of the FPID. The JTAG bus signal lines TDI, TDO, TCK and TMS are tied to four pins 72 connected to JTAG interface circuit 90. Control and data outputs of interface circuit 90 are connected in parallel and serial fashion to all of the I/O buffers 94.

Figure 7:
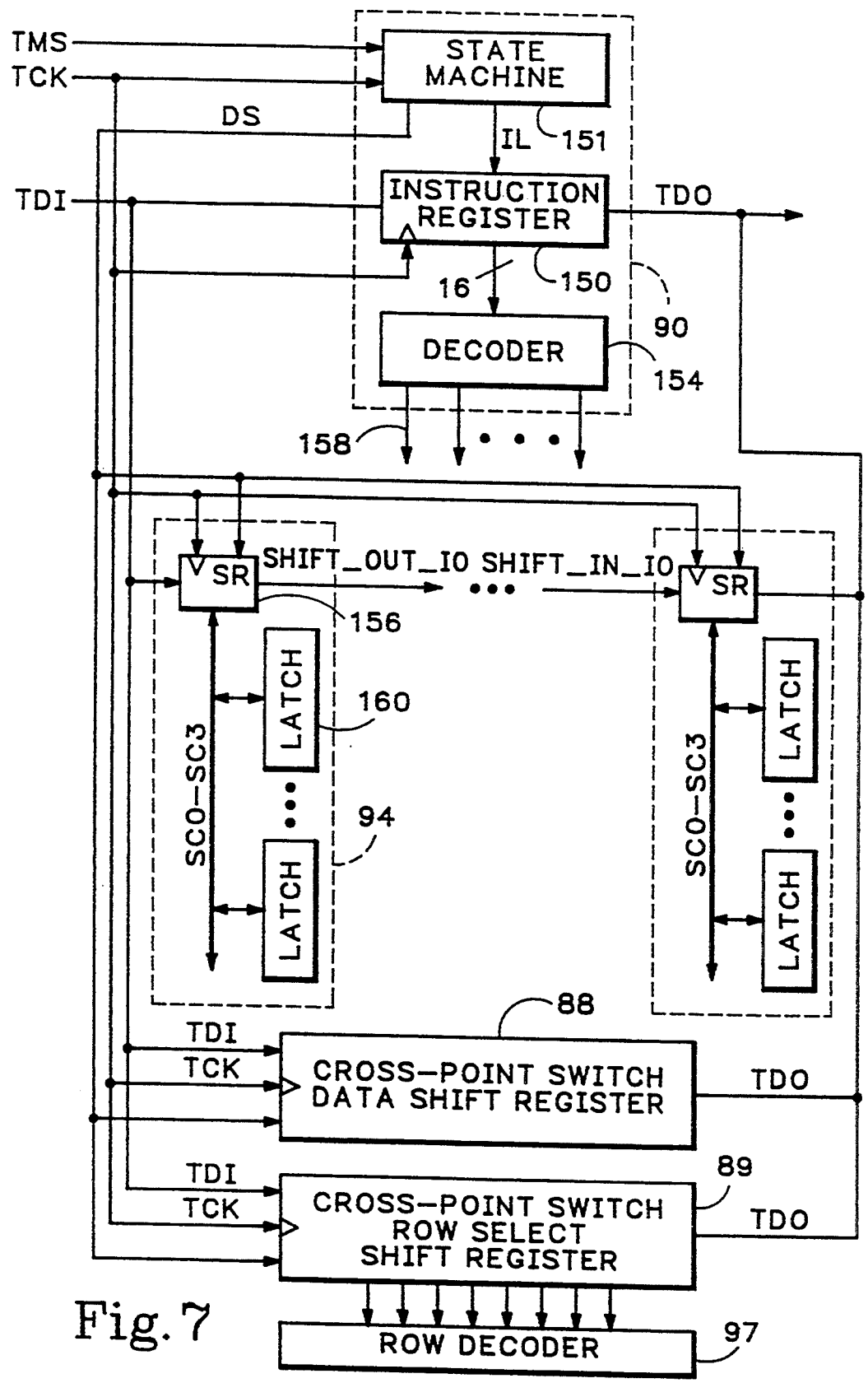
FIG. 7 illustrates a JTAG interface circuit in block diagram form.

FIG. 7 illustrates the JTAG interface circuit 90 of FIG. 6. The JTAG bus arrives at the FPLM through connector 25 of FIG. 1. The IEEE standard JTAG bus is intended for transmitting and sending serial data to and from digital circuit boards through a commercially available interface. Through the JTAG interface circuit 90, the host computer (or EPLD 18 of FIG. 4) can program the FPIDs to make the desired connections between devices mounted in sockets 12 and edge connectors 16 of FIG. 4. Each FPID 24 port selectively provides any of several types of buffering. The host computer uses the JTAG interface circuit 90 to select the type of buffering provided by each port. Each FPID can introduce an adjustable amount of port-to-port delay in signals passing through the device. The host computer also uses the JTAG interface to select the desired delay. Each FPID 24 also stores a record of the last 16 data bits appearing at each of its 160 ports. This type of data helps a user to understand the operation of the prototype electronic system. The JTAG interface circuit permits the host computer to access and display that data. The four JTAG lines are Test Data In (TDI), Test Data Out (TDO), Test Clock (TCK) and Test Mode Select (TMS). As discussed hereinbelow, all devices on the bus (i.e. all FPIDs) are connected in series with the TDO pin of one device connected to the TDI pin of the next. The TDI and TDO pins of the first and last devices are tied to host computer.

The TMS signal is supplied as input to a state machine 151 clocked by the TCK signal. The TMS signal indicates whether the JTAG bus is in an instruction loading or data shifting phase of operation. State machine 151 operates in a manner indicated by the IEEE JTAG bus standard 1149.1 to produce two signals IL and DS. The state machine asserts the IL signal during the instruction loading phase and asserts the DS signal during the data shifting phase of JTAG bus operation.

During the instruction loading phase, the host computer shifts a 16-bit instruction via the TDI line into a serial instruction register 150 in the JTAG interface circuit 90 that is input enabled by the IL signal from state machine 151. The TCK signal clocks the instruction data into register 150. This instruction is decoded by a decoder 154 which supplies read or write control signals 158 to latches, buffers and other devices within the FPIDs 24 on the FPLM. The data stored in these devices controls FPID operation.

The control signals produced by decoder 154 select devices 160 in FPID I/O buffers 94 to read or write access a 4-bit bus SC0–SC3 connected to a parallel input of a 4-bit shift register 156, also included in each FPID I/O buffer 94. The 4-bit shift registers 156 of all FPID buffers are connected in series. During a data shifting phase of bus operation, when the shift registers 156 are enabled by the DS output signal of state machine 151 and are selected by output signals 158 of decoder 154, the host computer can serially shift data into all shift registers 156 via the TDI line and can read data shifted out of these registers via the TDO line. The data stored in the latches and other devices 160 connected to the SC0–SC3 bus controls FPID operation.

The read/write control signal outputs of instruction decoder 154 may also select cross-point switch data shift register 88 or row select shift register 89 to receive data from the JTAG bus when input enabled by the DS signal during a data shift phase of the bus. Shift register 88 (also seen in FIG. 5) supplies the switch control data to the cross-point switch. The row select shift register 89 supplies the row address to row decoder 97, also shown in FIG. 5.

Figure 8:
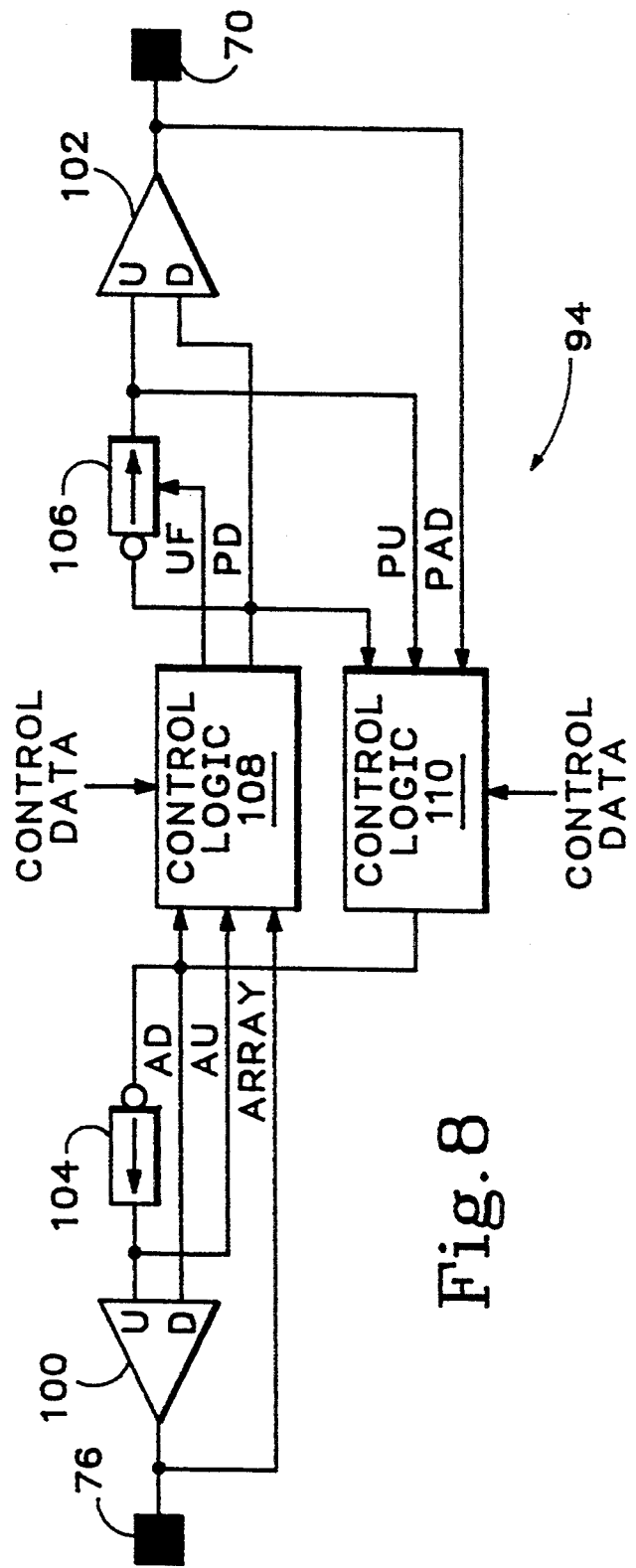
FIGS. 8 and 9 illustrate an I/O buffer of FIGS. 5 and 6 in block diagram form.

FIG. 8 illustrates an I/O buffer 94 of FIG. 6 in simplified block diagram form. I/O buffer 94 includes an output buffer 100 for driving the array port 76 and an output buffer 102 for driving the I/O port 70. The output AU of a single-shot device 104 controls a pull up input U of buffer 100 while the output PU of another single-shot device 106 controls the pull up input U of buffer 102. The output PD of a control logic circuit 108 drives the single-shot device 106 and the pull down input D of buffer 102. Similarly, the output AD of another control logic circuit 110 drives the single-shot device 104 and the pull down input D of buffer 100. The output of single-shot device 106 is forced high when a UF output of control logic circuit 108 is high. Inputs to control logic circuit 108 include AU, AD, and the signal ARRAY on array port 76 from the cross-point switch array. Inputs to control logic circuit 110 include PU, PD and the signal PAD at I/O port 70, an external pin of the FPID.

In response to control data supplied to control logic circuits 108 and 110, the I/O buffer 94 can operate in one of eleven different modes as follows.

Unidirectional input (UI)

In this mode the circuit passes data signals in one direction from I/O port 70 to cross-point array port 76. Logic circuit 108 and single-shot device 106 hold PD and PU low so that buffer 102 does not pull up or down on PAD. Logic circuit 110 drives AD low when PAD is high so that an AU pulse from single-shot device 104 causes buffer 100 to pull up ARRAY. Trickle charges in buffer 100 hold ARRAY up after the PU pulse goes away. LOGIC circuit 110 drives AD high when PAD is low so that buffer 100 pulls down ARRAY.

Unidirectional inverted input (UII)

In this mode the circuit inverts signals at I/O port 70 and passes them to cross-point array port 76. Logic circuit 108 and single-shot device 106 hold PD and PU low so that buffer 102 does not pull up or down on PAD. Logic circuit 110 drives AD low when PAD is low so that an AU pulse from single-shot device 104 causes buffer 100 to pull up ARRAY. Trickle charges in buffer 100 hold ARRAY up after the PU pulse goes away. LOGIC circuit 110 drives AD high when PAD is high so that buffer 100 pulls down ARRAY.

Unidirectional output (UO)

In this mode the circuit passes data signals in one direction from cross-point array port 76 to I/O port 70. Logic circuit 110 and single-shot device 104 hold AU and AD low so that buffer 100 does not pull up or down on ARRAY. Logic circuit 108 drives PD low when ARRAY goes high. Single-shot device, responds by pulsing PD, causing buffer 102 to pull up PAD, and trickle charges in buffer 102 hold PAD up thereafter. Logic circuit 108 drives PU low when ARRAY is low so that buffer 102 pulls down PAD.

Bi-directional buffer (BDR).

In this mode the circuit passes data signals in either direction between I/O port 70 and cross-point array port 76 depending on which signal ARRAY or PAD is externally driven. In this mode, control logic circuits 108 and 110 act like three-input NOR gates. In the quiescent state, when neither port is externally driven, trickle charges in buffers 100 and 102 hold both PAD and ARRAY high. Control logic circuits 108 and 110 hold PD and AD low and single-shot devices 104 and 106 hold PU and AU low. When an external device pulls ARRAY low, control logic circuit 108 turns on PD, thereby causing buffer 102 to pull down PAD. When the external device releases ARRAY, trickle charges in buffer 100 pull up on array and control logic circuit 108 responds by pulling PD down. The falling edge of PD causes single-shot device 106 to pulse PU high, thereby causing buffer 102 to quickly pull up PAD. Thereafter, trickle charges in buffer 102 continue to hold PAD up. When an external device pulls PAD low, control logic circuit 110 pulls up AD, thereby causing buffer 100 to pull down ARRAY. When the external device releases PAD, trickle charges in buffer 102 pull PAD back up. Control logic circuit 110 then pulls AD down, and the falling edge of AD causes single-shot device 104 to pulse AU high. Buffer 100 then briefly pulls up ARRAY. Thereafter, trickle charges in buffer 100 continue to hold ARRAY up.

Tri-state unidirectional input (TUI)

In this mode the circuit passes data signals in one direction from I/O port 70 to cross-point array port 76 when a tri-state input signal TS to control logic circuit 110 is held high. Logic circuit 108 and single-shot device 106 always hold PD and PU low so that buffer 102 does not pull up or down on PAD. Logic circuit 110 and single-shot device 104 normally hold AD and AU low when TS is low. When TS and PAD are driven high, logic circuit 110 drives AD low. Single-shot device 104 responds by pulsing AU so that buffer 100 pulls up ARRAY. Trickle charges in buffer 100 hold ARRAY up thereafter. When TS is high and PAD is driven low, logic circuit 110 drives AU low so that buffer 100 pulls down ARRAY.

Tri-state unidirectional inverted input (TUII)

In this mode the circuit inverts data signals at I/O port 70 and passes them to cross-point array port 76, provided tri-state input signal TS to control logic circuit 110 is held high. Logic circuit 108 always holds PU and PD low so that buffer 102 does not pull up or down on PAD. Logic circuit 110 normally holds AD and AU low when TS is low. When TS and PAD are driven high, logic circuit 110 drives AU low and AD high so that buffer 100 pulls down ARRAY. When TS is high and PAD is low, logic circuit 110 drives AU high and AD low so that buffer 100 pulls up ARRAY.

Tri-state unidirectional output (TUO)

In this mode the circuit passes data signals in one direction from cross-point array port 76 to I/O port 70 when the tri-state input signal TS to control logic circuit 108 is held low. Logic circuit 110 and single-shot device 104 always hold AD and AU low so that buffer 100 does not pull up or down on ARRAY. In the quiescent state, when TS is high, logic circuit 108 and single-shot device 106 hold PU and PD low so that buffer 102 does not control PAD. When TS is driven low and ARRAY is driven high, logic circuit 108 drives PD low. Single-shot device 106 pulses PU so that buffer 102 pulls up PAD. Trickle charges in buffer 102 hold up PAD thereafter. When TS is low and ARRAY is low, logic circuit 108 drives PD high so that buffer 102 pulls down PAD.

Tri-state hi-directional buffer (TBDR)

In this mode the circuit passes data signals in either direction between I/O port 70 and cross-point array port 76 depending on which signal ARRAY or PAD is externally driven, provided the tri-state input signal TS is high for input and low for output. In the quiescent state, when neither port is externally driven, trickle charges in buffers 100 and 102 hold PAD and ARRAY up. Control logic circuits 108 and 110 hold PD and AD low. Single-shot devices 104 and 106 hold PU and AU low. When an external device pulls ARRAY low in the presence of a low tri-state control signal TS, control logic circuit 108 turns on PD thereby causing buffer 102 to pull down PAD. When the external device releases ARRAY, trickle charges in buffer 100 pull ARRAY back up. Control logic circuit 108 responds by pulling PD down. The falling edge of PD causes single-shot device 106 to pulse PU high, thereby causing buffer 102 to quickly pull up PAD. Thereafter trickle charges in buffer 102 continue to hold PAD up. When an external device pulls PAD low while TS is high, control logic circuit 110 pulls up AD thereby causing buffer 100 to pull down ARRAY. When the external device releases PAD, trickle charges in buffer 102 pull PAD back up. Control logic circuit 110 then pulls AD down, and the falling edge of AD causes single-shot device 104 to pulse AU high. Buffer 100 then briefly pulls up ARRAY. Thereafter, trickle charges in buffer 100 continue to hold ARRAY up.

Force logic "1" output (FL1O)

In this mode control logic circuit 108 holds PD low and holds UF high. The high UF signal drives up the PU output of single-shot device 106 which causes buffer 102 to pull up PAD.

Force logic "0" output (FL0O)

In this mode control logic circuit 108 holds PD high, thereby causing buffer 102 to pull down PAD regardless of the state of ARRAY.

No connect (NC)

In this mode control logic circuit 108 drives PD low and control logic circuit 110 drives AD low so that the outputs of buffers 100 and 102 float.

In any mode where signals pass from array port 76 to I/O port 70, the I/O buffer 94 of FIG. 8 will delay signal transfer by 0, 20, 40 or 60 nanoseconds as determined by control data supplied control logic circuit 108. Logic circuit 108 delays change in state of its PD output signal accordingly.

Figure 9:
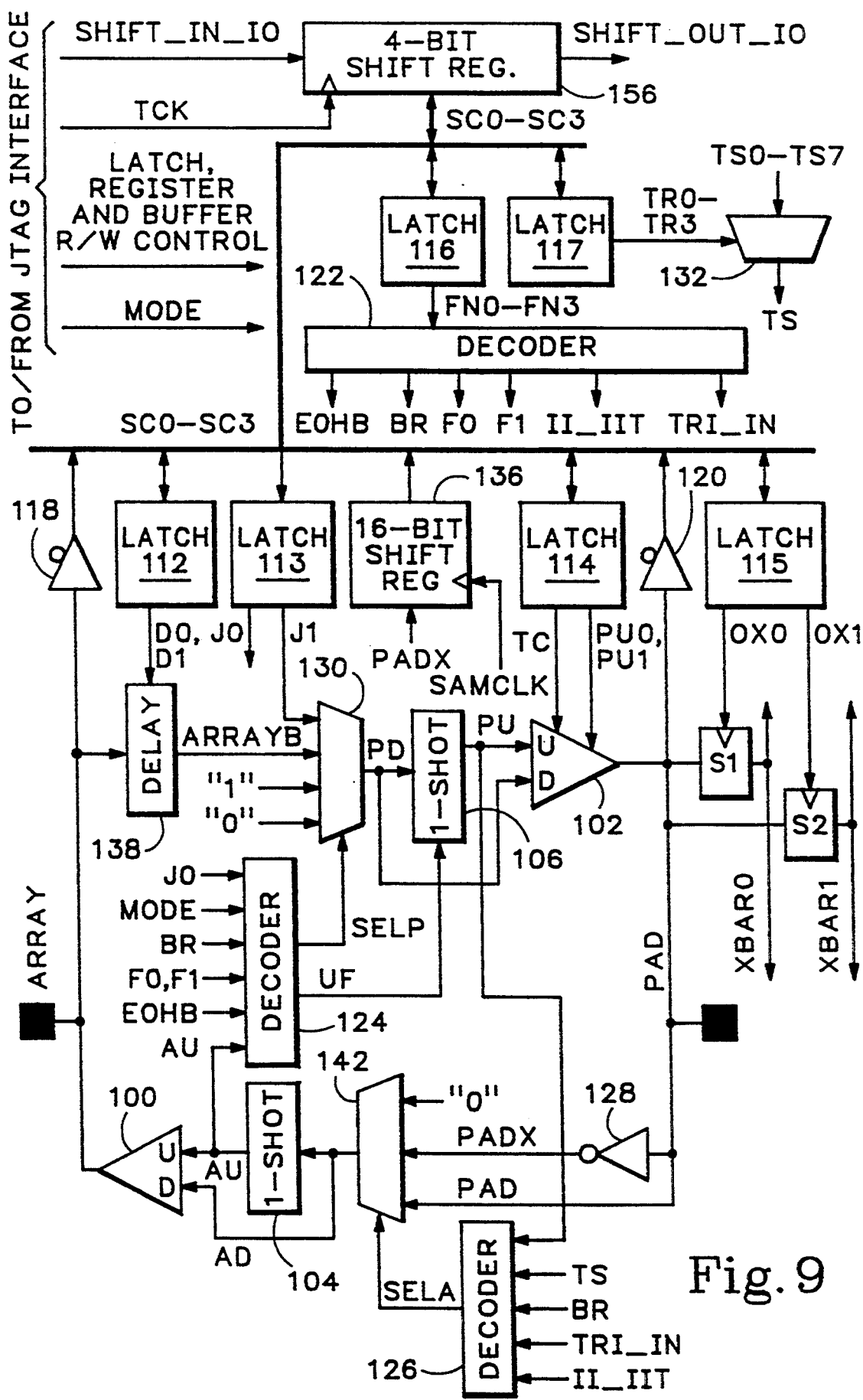

FIG. 9 depicts an I/O buffer 94 of FIG. 6 in more detailed block diagram form to illustrate the contents of control logic blocks 108 and 110 and to illustrate additional features of the buffer not apparent in FIG. 8. The I/O buffer includes a 4-bit shift register 156 that shifts in a data signal SHIFT_IN_IO and shifts out a data signal SHIFT_OUT_IO. Shift registers of all I/O buffers are connected in series with the SHIFT_OUT_IO signal of one I/O buffer providing the SHIFT_IN_IO signal to the next of the series. The JTAG interface circuit 90 of FIG. 6 supplies the JTAG signal TDI as the SHIFT_IN_IO to the first buffer of the series, and connects the SHIFT_OUT_IO signal of the last buffer of the series to JTAG TDO line. The TCK JTAG signal clocks shift register 156 and a control signal from the JTAG controller input enables register 156.

The host computer may load control data into the shift registers 156 of all I/O buffers via the JTAG bus. One or more of the four data bits SC0-SC3 stored in shift register 156 are supplied as inputs to a set of latches 112–117, any one of which may be write enabled by the host computer via the JTAG interface. The following control data is supplied to latches in the I/O buffer via shift register 156:

D0,D1

These bits are stored in latch 112 and control the amount of signal delay passing through the buffer.

J0,J1

These bits are stored in latch 113 and are used to control the state of output buffer 102 when a MODE signal from the JTAG controller is asserted.

TC,PU0,PU1

These bits are stored in latch 114. The TC bit controls the maximum positive output swing (3 or 5 volts) of buffer 102 for compatibility with TTL or CMOS devices. The PU0 and PU1 bits switch output current sources (3, 17 or 20 mA) in buffer 102.

OX0,OX1

These bits are stored in latch 115 and control a pair of switches S1 and S2 for selectively connecting the PAD output of buffer 102 to the XBAR0 and XBAR1 outer crossbar transfer gates.

FN0–FN3

These bits are stored in latch 116 and select the operating mode of the buffer: unidirectional input, unidirectional inverted input, unidirectional output, bi-directional buffer, tri-state unidirectional input, tri-state unidirectional inverted input, tri-state unidirectional output, tri-state bi-directional buffer, force logic "1" output, force logic "0" output, or no connect.

TR0–TR3

These bits are stored in latch 117 control a multiplexer 132 that selects the particular one of eight lines TS0-TS7 to be employed as tri-state control signal TS for the buffer.

Control logic circuit 108 of FIG. 8 is implemented by the combination of decoders 122 and 124, a multiplexer 130 and a variable delay circuit 138. The ARRAY signal is delayed by a variable amount of time and supplied as an ARRAYB input to multiplexer 130. Delay circuit 138 delays the ARRAY signal by 0, 10, 20 or 30 nanoseconds depending of the state of the D0,D1 bits stored in latch 112. A logic "0", a logic "1" and the J1 bit stored in latch 113 are also supplied as inputs to multiplexer 130. The output of multiplexer 130 is PD signal supplied as input to single-shot device 106 and to the pull down input of buffer 102. As discussed below, decoder 124 decodes several input signals from decoder 122 and elsewhere to produce an output signal SELP that controls the switching state of multiplexer 130. Decoder 124 also produces the UF signal that can force up the PD output of single-shot device 106.

Control logic circuit 110 of FIG. 8 is implemented by the combination of decoders 122 and 126, an inverter 128 and a multiplexer 142. The PAD signal is inverted by inverter 128 to produce a PADX signal. PADX and PAD are supplied as inputs to multiplexer 142. A "0" logic level is tied to another input of multiplexer 142. Multiplexer 142 selects one of its inputs as the AD output applied to the pull down D input of buffer 100 and to the input of single-shot device 104. As discussed below, decoder 126 decodes several input signals to produce a signal SELA that controls multiplexer 142.

Decoder 122 decodes the mode control bits FN0–FN3 from latch 116 and a MODE signal from the JTAG controller to produce the following signals used locally within the buffer:

EOHB

This signal, when not active, tells decoder 124 to select the 0 logic level input to multiplexer 130. This causes PD and PU to remain low so that buffer 102 can neither pull up nor pull down PAD. When EOHB is active, decoder 124 can select an input to multiplexer 130 that may drive PD up. Decoder 122 asserts EOHB when the FN0–FN3 bits indicate the I/O buffer is in the unidirectional output mode, in the bi-directional buffer mode, or in the tri-state bi-directional buffer mode.

BR

This signal tells decoders 124 and 126 when the I/O buffer is to operate in one of the bi-directional buffer modes. When BR is asserted, decoder 124 switches multiplexer 130 to select the output of delay circuit 138 (unless inhibited by AU) and decoder 126 switches multiplexer 142 to select its PAD input (unless inhibited by PU).

TRI_IN

This signal tells decoder 126 that the I/O buffer is in one of the tri-state modes. When TRI_IN is asserted, decoder 126 tells multiplexer 142 to select its "0" input unless the tri-state control signal TS is asserted. When TS is asserted, decoder 126 tells multiplexer 142 to select the PAD input.

II_IIT

This signal is asserted when the I/O buffer is in one of the inverting modes and causes decoder 126 to switch multiplexer 142 to select its PADX input.

F0

This signal is asserted when the I/O buffer is in the force "0" logic output mode. It tells decoder 124 to select the logic "1" input to multiplexer 130, thereby driving up the PD input to buffer 102 and pulling down its output PAD.

F1

This signal is asserted when the I/O buffer is the force "1" logic output mode. It tells decoder 124 to assert its UF output to force up the output PU of one-shot device 106. This causes buffer 102 to drive PAD high.

The following is a truth table for decoder 124. An "X" indicates the signal is asserted, a "O" indicates the signal is not asserted and a "-" means signal state is not relevant.

TABLE I

| MODE OF OPERA-TION | INPUTS | | | | | OUTPUTS | |
|---|---|---|---|---|---|---|---|
| | F0 | F1 | BR | MODE | EOHB | SELP | UF |
| UI | O | O | O | O | O | "0" | O |
| UII | O | O | O | O | O | "0" | O |
| UO | O | O | O | O | X | ARRAYB | O |
| BDR | O | O | X | O | X | ARRAYB* | O |
| TUI | O | O | O | O | O | "0" | O |
| TII | O | O | O | O | O | "0" | O |
| TUO | O | O | O | O | X | ARRAYB | O |
| TBDR | O | O | X | O | X | ARRAYB* | O |
| FL1O | O | X | — | O | — | "0" | X |
| FL0O | X | O | — | O | — | "1" | O |
| NC | O | O | X | O | O | "0" | O |
| ANY MODE | — | — | — | X | — | J1 | J0 |

*AU when asserted requires SELP selection of "0" in the bi-directional buffer modes.

The following is a truth table for decoder 126. An "X" indicates the signal is asserted, a "O" indicates the signal is not asserted and a "-" means signal state is not relevant.

TABLE II

| MODE OF OPERTION | INPUTS | | | | OUTPUT |
|---|---|---|---|---|---|
| | TS | BR | TRI_IN | II_II | SELA |
| UI | — | O | — | O | PADX |
| UII | — | O | O | X | INVERSE PADX |
| UO | O | X | X | — | "0" |
| BDR | — | X | O | — | PADX* |
| TUI | X | O | X | O | PADX |
| TII | X | O | X | X | INVERSE PADX |
| TUO | O | X | X | — | "0" |
| TBDR | X | X | X | — | PADX* |
| FL1O | O | X | X | — | "0" |
| FL0O | X | X | X | — | "0" |
| NC | O | X | X | — | "0" |

*PD when asserted requires "0" as SELA output in the bi-directional buffer modes.

The following is a truth table for decoder 122. An "X" indicates the signal is asserted, a "O" indicates the signal is not asserted.

TABLE III

| INPUT FN0-FN3 | OUTPUTS | | | | | |
|---|---|---|---|---|---|---|
| | EOHB | BR | F0 | F1 | II_IIT | TRI_IN |
| UI | O | O | O | O | O | O |
| UII | O | O | O | O | X | O |
| UO | X | O | O | O | O | O |
| BDR | X | X | O | O | O | O |
| TUI | O | O | O | O | O | X |
| TII | O | O | O | O | X | X |
| TUO | X | O | O | O | O | O |
| TBDR | X | X | O | O | O | O |
| FL1O | O | O | O | X | O | O |
| FL0O | O | O | X | O | O | O |
| NC | O | X | O | O | O | O |

Figure 10:
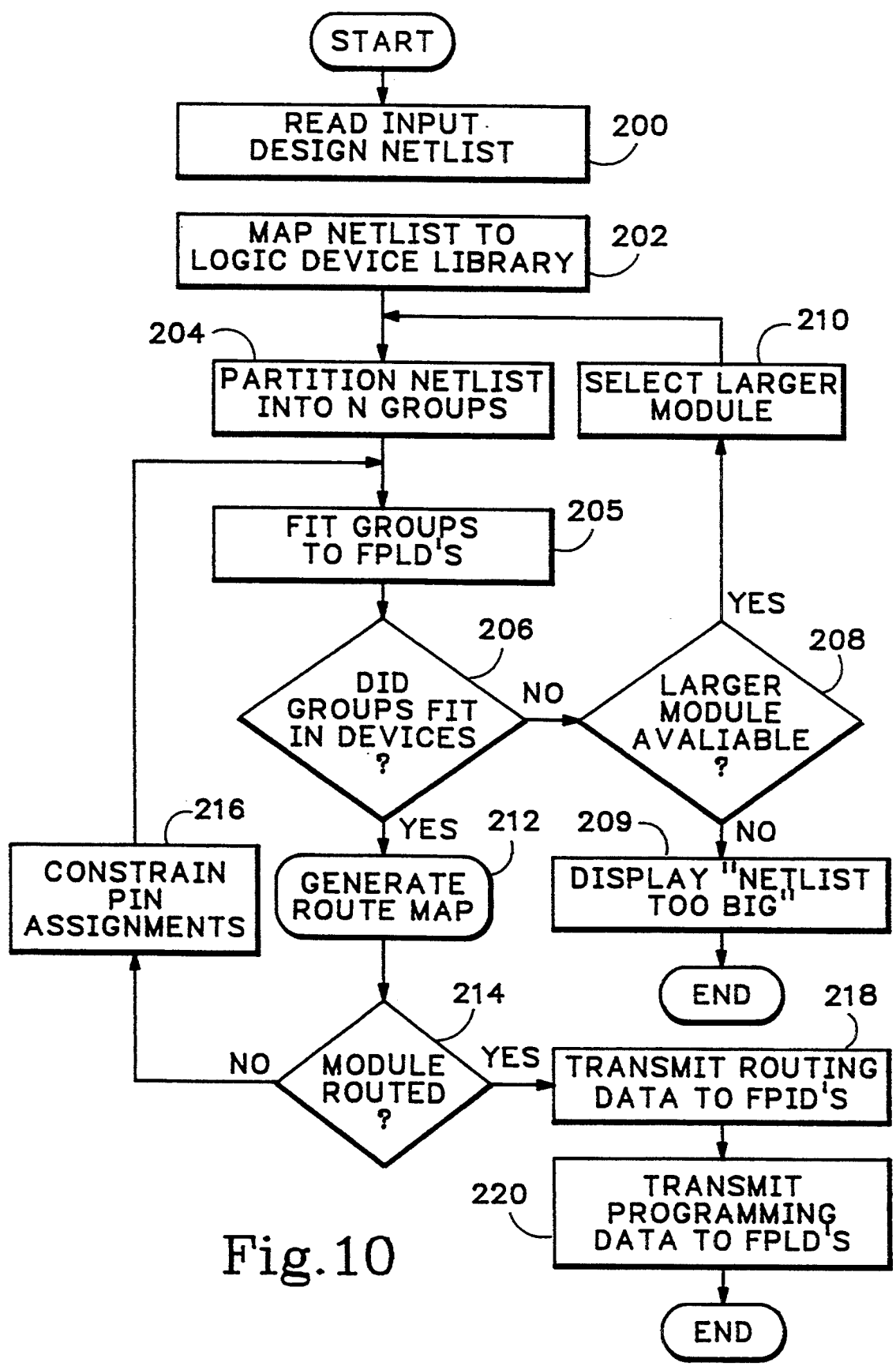
FIGS. 10 and 11 are flow charts illustrating operation of a host computer in programming the field programmable logic module of FIG. 4.

FIG. 10 is a flow chart illustrating operation of a host computer in generating FPID programming data for FPIDs 24 and FPLDs of FIGS. 1-4. As discussed hereinabove, the host computer may store the FPID programming data in EPROM 17 of FIG. 4 for subsequent transmission to FPIDs 24 by EPLD 18 of FIG. 4, or the host computer may directly transmit the FPID programming data to FPIDs 24 of FIG. 4 via the JTAG bus and socket 25 or the edge connector pins 16 that access the JTAG bus.

Referring to FIG. 10, the host computer initially reads a netlist (step 200) describing the design of the logic circuit to be implemented by the FPLDs. The netlist is then mapped into the FPLDs macro library (step 202) and the netlist is partitioned into N groups (step 204). N is the number of FPLDs that can be mounted in the FPLM. The host computer then attempts to fit each logic group into a corresponding FPLD (step 205). If (step 206) the host computer determines that it could not fit a logic group into an FPLD, the host computer determines whether a higher capacity FPLM (i.e., an FPLM having more or larger capacity FPLDs and/or greater routing capability) is available (step 208), selects the larger FPLM (step 210) and returns to step 204 to repartition the netlist. If at step 208 the program determines no higher capacity FPLM is available, the program displays an indication that the circuit is too large to be implemented (step 209) and ends.

When at step 206 the host computer determines that the logic groups fit within the selected FPLDs, it attempts to generate a routing map (step 212) indicating how the signals are to be routed through the FPIDs. If the computer determines that it cannot route the module (step 214), it places constraints on the pin assignments for the FPLDs to ease routability problems (step 216) and returns to step 205. When at step 214, the computer determines that the module is routable, it transmits routing data to the FPIDs or EPROM (step 218) and transmits programming patterns to the FPLDs (step 220).

Figure 11:
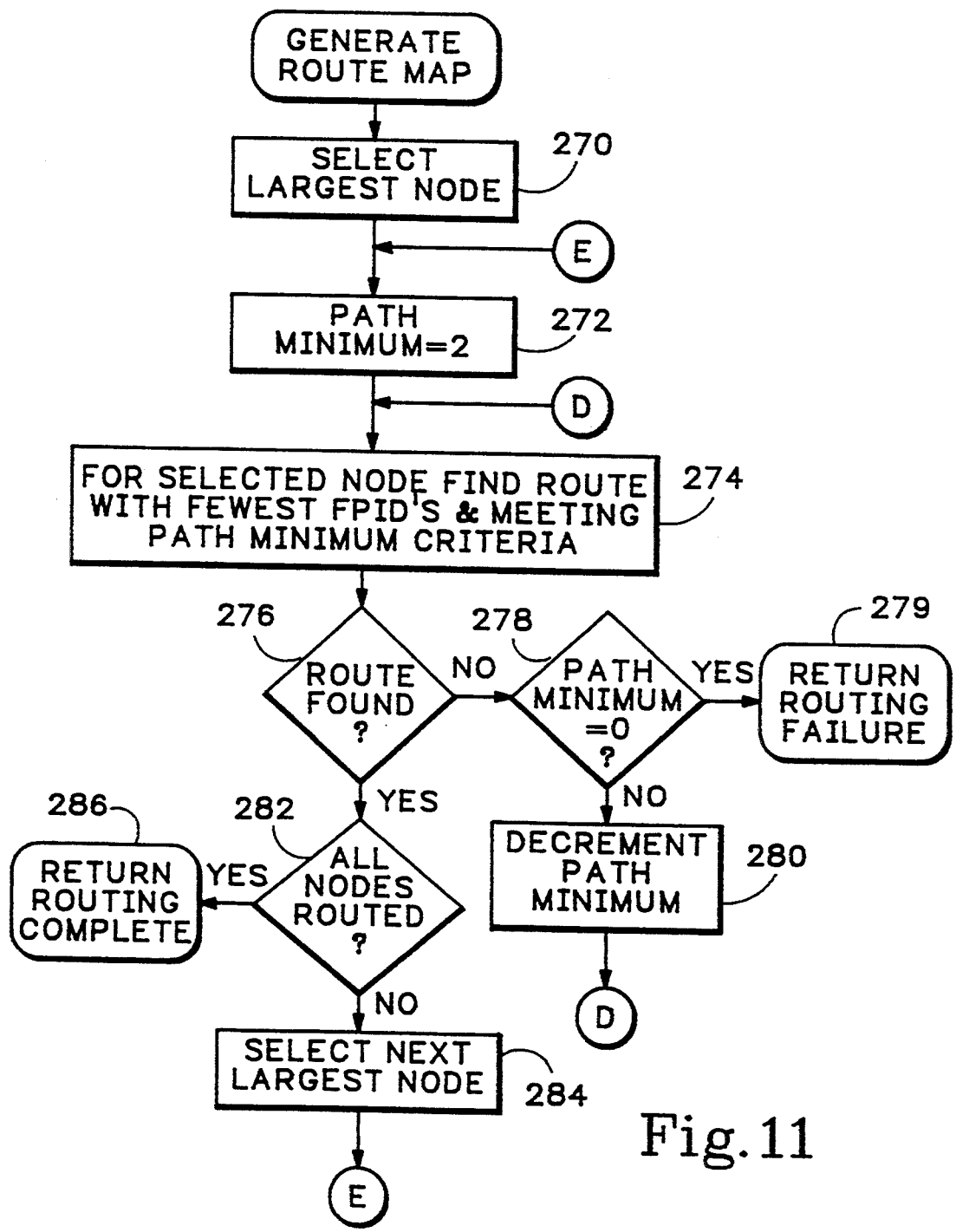

Subroutines implementing steps 202, 204 and 205 are typically supplied by vendors of the FPLDs. FIG. 11 illustrates the GENERATE ROUTE MAP subroutine called at step 212 of FIG. 10. The GENERATE ROUTE MAP subroutine represents circuits being interconnected as a set of nodes. Each "node" is the set of all device pins in a circuit that must be logically tied together. A route is a set of FPIDs and their interconnecting wires that can tie together a circuit node. Since FPIDs are interconnected in many ways, there are many possible routes for each node. But in order to use the FPLM routing resources efficiently, the GENERATE ROUTE MAP routine attempts to select the routes requiring the fewest number of FPIDs. However, as it routes each node in succession, the routine tries not to choose routes that use up all of the available wires between any two FPIDs. This helps to reserve paths for nodes not yet routed.

The routine first (step 270) selects the largest node of the circuit. The largest node is the node connecting the most device terminals. The routine then sets a PATH MINIMUM parameter equal to 2 (step 272). For the selected node, the routine next searches for the route requiring the smallest number of FPIDs, provided the route also satisfies a path minimum criteria (step 274). To satisfy the path minimum criteria, the routine must not route the node between two FPIDs unless the number of unused connections between those two FPIDs is two or more. This helps ensure that at least one wire between these two FPIDs will be available for other nodes that have not yet been routed.

If the routine finds it cannot route the selected node without violating the path minimum criteria (step 276), it checks whether PATH MINIMUM is 0 (step 278). If so, that means it is impossible to route the node with the remaining unassigned routing resources. In such event, the routine returns a ROUTING FAILURE flag to the calling routine (step 279). If at step 278 the PATH MINIMUM parameter is not already 0, the routine decrements the PATH MINIMUM parameter to 0 (step 280) and returns to step 274 to attempt once again to find the smallest possible route for the node. But this time the routine does not try to avoid using up the last wire path between any two FPIDs.

If at step 276 the routine determines that it has found a route for the node, then it determines whether it has routed all nodes on the FPLM (step 282). If not, it selects the next largest node (step 284) and returns to steps 272 and 274 where it resets the PATH MINIMUM parameter to 2 and attempts to route the newly selected node. When at step 276 the routine determines it has routed all nodes, it returns a ROUTING COMPETE flag to the calling routine (step 286).

Figure 12:
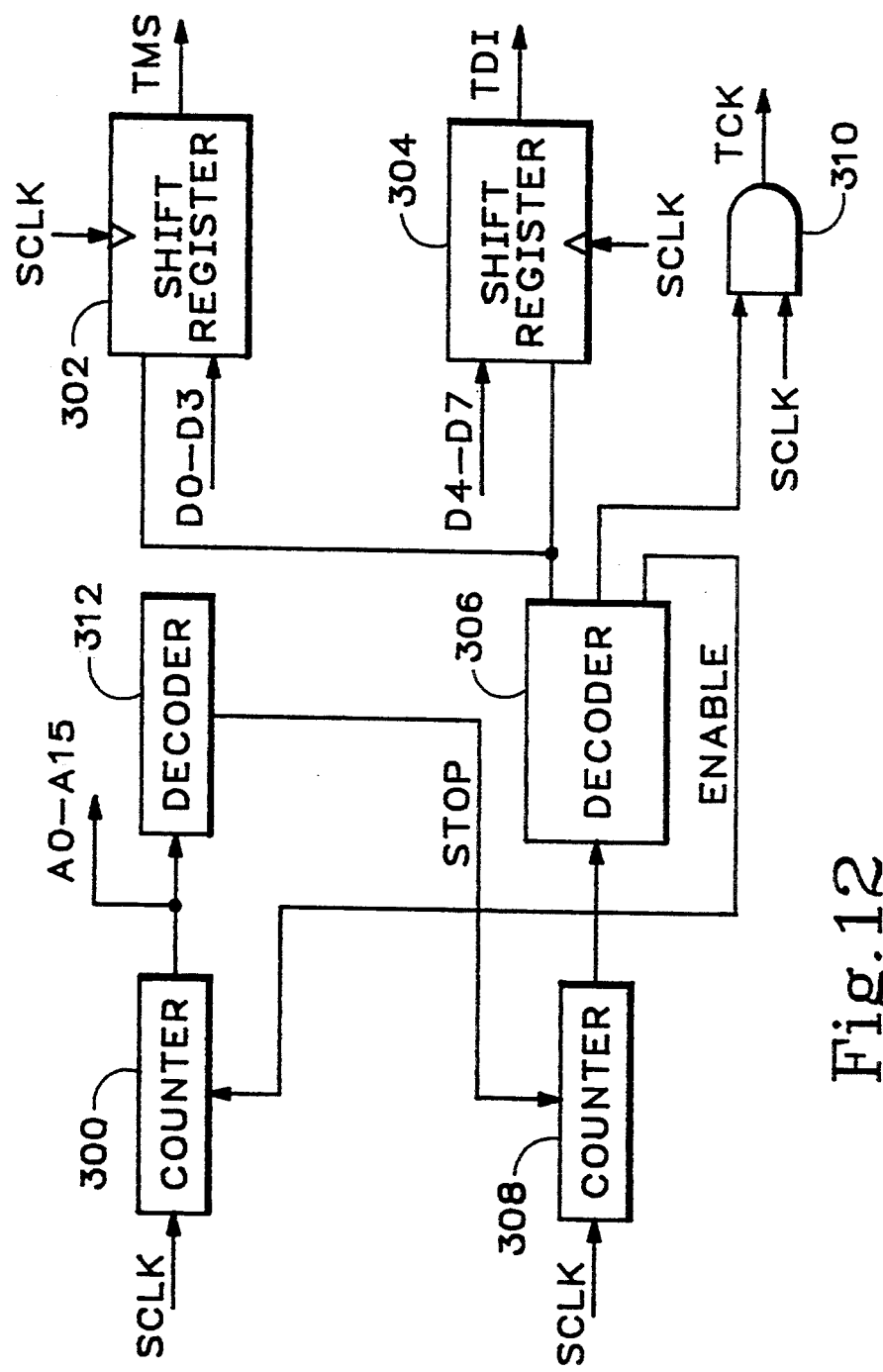
FIG. 12 is a block diagram illustrating the configuration of the electronically programmable logic device 18 or FIG. 2.

FIG. 12 is a block diagram illustrating the configuration of the electronically programmable logic device 18 (EPLD) of FIG. 2. On system startup, EPLD 18 sequentially addresses EPROM 17, causing the EPROM to sequentially read out 8-bit data words D0–D7. EPLD 18 sequentially transmits the bits of words D0–D7 to the FPIDs as the JTAG bus signals TMS and TDI for programming the FPIDs to make the appropriate connections. EPLD 18 also generates JTAG bus TCK signal.

Referring to FIG. 12, a counter 300 counts a clock signal (SCLK) generated by clock circuit 20 of FIG. 4 to produce a sixteen-bit address A0–A15 supplied to address input terminals of EPROM 17 of FIG. 4. When addressed, EPROM 17 reads out an eight-bit data word D0–D7. The first four bits D0–D3 are supplied as input to a parallel-in/serial-out shift register 302 while the second four bits D4–D7 are supplied as input to another similar shift register 304. Each time shift registers 302 and 304 receive four new input data bits, they serially shift the four bits out as JTAG bus signals TMS and TDI, respectively. The SCLK signal clocks shift out for both shift registers.

The output of a decoder 306 controls shift-in/shift-out mode of operation of shift registers 302 and 304. Decoder 306 also produces an ENABLE signal that enables counter 300. Decoder 306 decodes a three-bit output of a counter 308 which counts SCLK signal pulses. On a first SCLK pulse, decoder 306 enables counter 300, allotting counter 300 to increment address A0–A15. On the next SCLK pulse decoder 306 input enables shift registers 302 and 304, causing them to load the next data word D0–D7. On the following four SCLK pulses, decoder 306 output enables shift registers 302 and 304, permitting them to shift out their stored data. At the same time, decoder 306 also asserts an input of an AND gate 310. The SCLK clock signal drives another input of AND gate 310. AND gate 310 asserts the JTAG TCK signal at its output whenever the SCLK signal is asserted.

After all of the 4-bit data has been shifted out of registers 302 and 304, decoder 306 once again input enables counter 300 and shift registers 302 and 304. Counter 300 once again increments address A0–A15, and shift registers 302 and 304 once again shift in (and subsequently shift out) a new data word. The process continues until all data needed to program the FPIDs has been read out of the EPROM and serially transmitted to the FPIDs. A decoder 312 monitors the A0–A15 address produced by counter 300 and asserts a STOP signal when the address count reaches a limit, the maximum address of the data stored in EPROM 17 needed to program the FPIDs. The STOP signal inhibits the count of counter 308, thereby halting shift in/out operation of shift registers 302 and 304.

Thus there has been described a field programmable logic module providing a set of sockets for receiving pins of integrated circuits and other electronic components, a set of connector pins for providing external access to the board, and an array of FPIDs. The FPIDs which selectively connect terminals of the components mounted in the sockets to one another or to the external connector pins can be programmed to operate with various types of buffering, logic levels and delay times and to perform various logic operations at their output ports. We have further described each FPID being capable of sampling and storing data indicating states of its ports over the several system clock cycles for subsequent read out by a host computer.

While the foregoing specification has described a preferred embodiment of the present invention, one skilled in the art may make many modifications to the preferred embodiment without departing form the invention in its broader aspects. The appended claims therefore cover all such modifications as fall within the true spirit of the invention.

We claim:

1. An apparatus for mounting a plurality of electronic integrated circuit devices having pins for transmitting and receiving bi-directional signals and for flexibly routing said bi-directional signals between said pins in response to externally generated programming data provided as input to said apparatus, the apparatus comprising:

a circuit board having a top side and a bottom side;

a plurality of sockets mounted on the top side of said circuit board, each for receiving pins of separate ones of said electronic integrated circuit devices;

programmable interconnect means mounted on said bottom side of said circuit board and receiving said externally generated programming data, said programmable interconnect means having a plurality of signal ports and bi-directional buffer means for providing buffered interface for conveying bi-directional signals between pairs of its signal ports selected in response to said programming data;

means for conveying said externally generated programming data to said programmable interconnect means; and a plurality of conductors each disposed on said circuit board for routing said bi-directional signals between ones of said signal ports and pins of said electronic integrated circuit devices received by said sockets, wherein said programmable interconnect means comprises:

a plurality of switch ports;

a plurality of said signal ports;

switch means connected to said means for conveying for receiving said programming data and for selectively interconnecting pairs of said plurality of switch ports for transmitting said bi-directional signals bi-directionally therebetween in response to said programming data; and a plurality of bi-directional buffers, each bi-directional buffer connecting a separate pair of said switch and signal ports and each bi-directional buffer buffering said bi-directional signals passing in either direction between the pair of switch and signal ports it connects, wherein each of said bi-directional buffers comprises:

first unidirectional buffer means connected between one switch port and one signal port of said pair of switch and signal ports, and having a terminal receiving a first busy signal, for detecting whether said busy signal is either asserted or de-asserted and for detecting appearance of said one bi-directional signal at said one switch port, wherein while detecting appearance of said one bi-directional signal at said one switch port while concurrently detecting said first busy signal is de-asserted, said first unidirectional buffer means buffers said one bi-directional signal appearing at said one switch port onto said one signal port and concurrently asserts a second busy signal; and second unidirectional buffer means connected to said one signal port and said one switch port and having a terminal for receiving said second busy signal, for detecting whether said second busy signal is either asserted or de-asserted and for detecting appearance of said one bi-directional signal at said one signal port, wherein while detecting appearance of said one bi-directional signal at said one signal port while concurrently detecting said second busy signal is de-asserted, said second unidirectional buffer means buffers said one bi-directional signal appearing at said one signal port onto said one switch port and concurrently asserts said first busy signal.

2. The apparatus in accordance with claim 1 wherein said means for conveying comprises:

memory means mounted on said circuit board for receiving and storing said programming data provided as input to said apparatus; and data transfer means mounted on said circuit board for reading said programming data out of said memory means and providing the read out programming data as input to said programmable interconnect means.

3. An apparatus responsive to externally generated programming data, for mounting a plurality of electronic integrated circuit devices having device pins for transmitting and receiving bi-directional signals, for flexibly routing said bi-directional signals between said device pins and for interconnecting said integrated circuit devices to a first socket, said first socket being of the type for receiving pins of an integrated circuit, the apparatus comprising:

a circuit board having a top side and a bottom side;

a plurality of conductive external connector pins attached to and extending from said circuit board and arranged so that said external connector pins may be received by said first socket;

a plurality of second sockets mounted on the top side of said circuit board, each for receiving said device pins of separate ones of said electronic integrated circuit devices;

programmable interconnect means mounted on said bottom side of said circuit board, said programmable interconnect means having a plurality of signal ports and buffer means for providing bi-directional buffered interface between sets of its signal ports selected in response to said externally generated programming data;

means for conveying said externally generated programming data to said programmable interconnect means; and a plurality of conductors each disposed on said circuit board for routing bi-directional signals between ones of said signal ports and said device pins of said electronic integrated circuit devices received by said second sockets and between others of said signal ports and said external connector pin, wherein said programmable interconnect means comprises:

a plurality of switch ports;

a plurality of said signal ports;

switch means connected to said means for conveying for receiving said programming data and for selectively interconnecting pairs of said plurality of switch ports for transmitting said bi-directional signals bi-directionally therebetween in response to said programming data; and a plurality of bi-directional buffers, each bi-directional buffer connecting a separate pair of said switch and signal ports and each bi-directional buffer buffering said bi-directional signals passing in either direction between the pair of switch and signal ports it connects, wherein each of said bi-directional buffers comprises:

first unidirectional buffer means connected between one switch port and one signal port of said pair of switch and signal ports, and having a terminal receiving a first busy signal, for detecting whether said busy signal is either asserted or de-asserted and for detecting appearance of said one bi-directional signal at said one switch port, wherein while detecting appearance of said one bi-directional signal at said one switch port while concurrently detecting said first busy signal is de-asserted, said first unidirectional buffer means buffers said one bi-directional signal appearing at said one switch port onto said one signal port and concurrently asserts a second busy signal; and second unidirectional buffer means connected to said one signal port and said one switch port and having a terminal for receiving said second busy signal, for detecting whether said second busy signal is either asserted or de-asserted and for detecting appearance of said one bi-directional signal at said one signal port, wherein while detecting appearance of said one bi-directional signal at said one signal port while concurrently detecting said second busy signal is de-asserted, said second unidirectional buffer means buffers said one bi-directional signal appearing at said one signal port onto said one switch port and concurrently asserts said first busy signal.

* * * * *